United States Patent [19]
Fukutomi et al.

[11] Patent Number: 5,504,992
[45] Date of Patent: Apr. 9, 1996

[54] FABRICATION PROCESS OF WIRING BOARD

[75] Inventors: Naoki Fukutomi, Yuki; Yoshiaki Tsubomatsu, Tsuchiura; Toshio Yamazaki, Tsukuba; Masahiko Itabashi, Mitsukaido; Hirohito Ohhata, Tsukuba, all of Japan

[73] Assignee: Hitachi Chemical Company, Ltd., Japan

[21] Appl. No.: 268,866

[22] Filed: Jun. 30, 1994

Related U.S. Application Data

[63] Continuation-in-part of Ser. No. 983,342, Nov. 30, 1992, Pat. No. 5,426,850.

[30] Foreign Application Priority Data

| Nov. 29, 1991 | [JP] | Japan | 3-316252 |
| Apr. 23, 1992 | [JP] | Japan | 4-104975 |
| Jun. 30, 1993 | [JP] | Japan | 5-161731 |

[51] Int. Cl.⁶ .............. H05K 3/02; H05K 3/42
[52] U.S. Cl. .............. 29/847; 29/852; 427/97; 427/98; 216/108
[58] Field of Search ............ 29/846–849, 852, 29/DIG. 16; 156/654, 664–666, 901, 902; 204/192.1; 205/78; 427/96–98; 430/314, 315, 318; 437/228, 230, 246

[56] References Cited

U.S. PATENT DOCUMENTS

| 3,324,014 | 6/1967 | Modjeska | 29/848 X |
| 3,391,457 | 7/1968 | Reimann | 29/848 |
| 3,677,950 | 7/1972 | Alderncccio . | |
| 4,306,925 | 12/1981 | Lebow et al. | 430/315 X |
| 4,374,869 | 2/1983 | Dorey II, et al. . | |
| 4,606,787 | 8/1986 | Pelligrino | 156/666 X |
| 4,790,902 | 12/1988 | Wada et al. | 29/848 X |
| 5,017,271 | 5/1991 | Whewell . | |
| 5,118,386 | 6/1992 | Kataoka . | |

FOREIGN PATENT DOCUMENTS

| 0189975 | 8/1986 | European Pat. Off. . | |
| 0370133 | 11/1988 | European Pat. Off. . | |
| 0459665 | 5/1991 | European Pat. Off. . | |
| 0457501 | 5/1991 | European Pat. Off. . | |
| 0529578 | 3/1993 | European Pat. Off. . | |
| 0529577 | 3/1993 | European Pat. Off. . | |
| 34908 | 10/1979 | Japan | 29/852 |
| 54-35670 | 11/1979 | Japan . | |
| 13973 | 1/1980 | Japan | 29/847 |
| 44796 | 2/1990 | Japan | 29/852 |
| 02098139 | 4/1990 | Japan . | |
| 5-235519 | 9/1993 | Japan | 29/846 |

OTHER PUBLICATIONS

Chemical Abstracts, vol. 94, No. 10, Mar. 9, 1981.
Chemical Abstracts, vol. 108, No. 12, Mar. 21, 1988.
Chemical Abstracts, vol. 98, No. 2, Jan. 10, 1993.
Patent Abstracts of Japan, unexamined application, E field, vol. 15, No. 390.
Romankiw et al "Plating Through–Holes" IBM Tech. Discl. Bul., vol. 9, No. 10, Mar. 1967 pp. 1255–1256.

*Primary Examiner*—Peter Vo
*Attorney, Agent, or Firm*—Pennie & Edmonds

[57] ABSTRACT

The object of the present invention is to provide a wiring board fabrication process which is, not only so smooth on the surface that a fine wiring pattern can be formed thereon, but also suitable for mounting electronic parts having fine pitch terminals.

The present invention is a fabrication process of a wiring board which comprises a wiring conductive line embedded in the surface of an insulating substrate so that the upper face of the conductive line and the surface of the substrate are flat, and a through-hole land which is a conductive portion projected from the surface of the substrate in a through-hole portion, which is characterized in removing the conductive portion projected from the surface of the substrate in the through-hole portion so as to have a flat surface on the surface of the substrate.

3 Claims, 2 Drawing Sheets

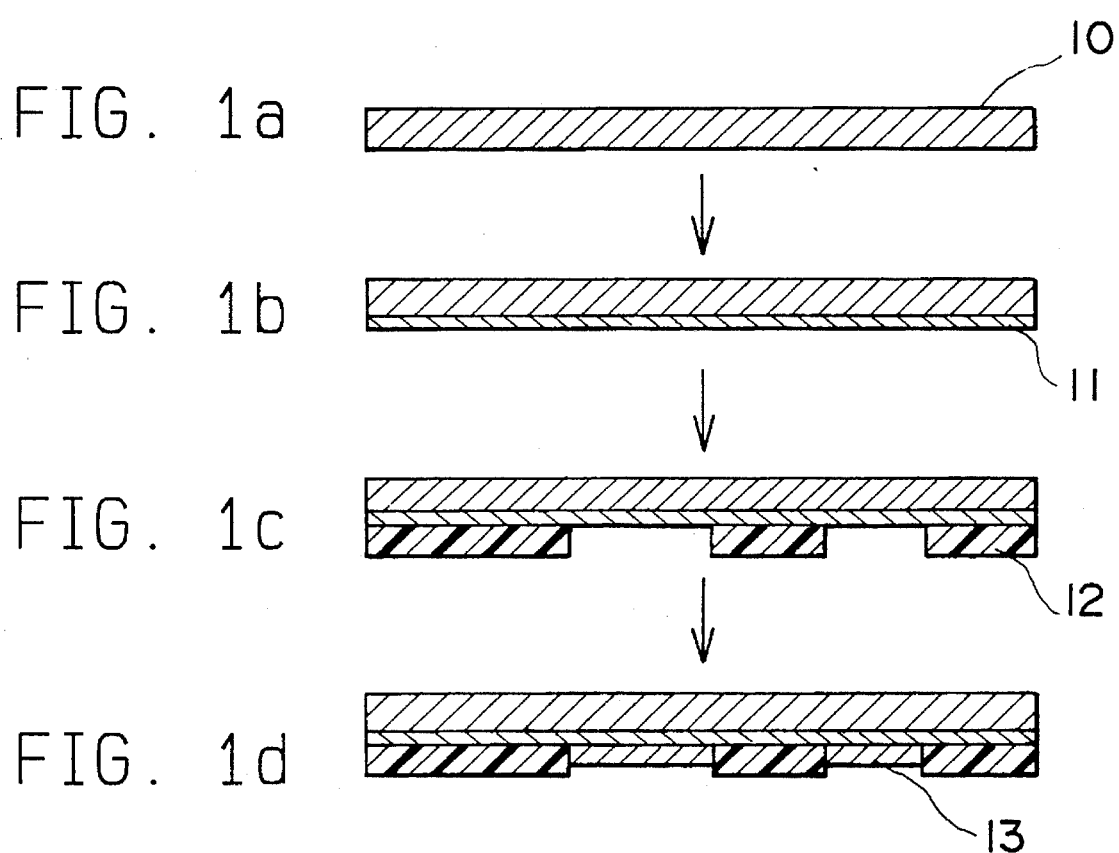

FABRICATION PROCESS OF WIRING BOARD

BACKGROUND OF THE INVENTION

This application is a Continuation-in-Part of application Ser. No. 07/983,342 filed on Nov. 30, 1992 now U.S. Pat. No. 5,426,850, which is incorporated herein by reference.

a) Field of the Invention

This invention relates to a process for the fabrication of a wiring board.

b) Description of the Related Art

The etched foil process has been used most widely as a process for the fabrication of wiring boards. According to the etched foil process, a wiring board is fabricated by forming an etching resist on a copper clad laminate, etching off the copper foil with an etchant at parts, where the etching resist is not formed, to form a desired wiring pattern, and then removing the etching resist.

Although the etched foil process is simple and is excellent in productivity, it cannot form a high-density or high-accuracy pattern because the thickness of the copper foil of a copper clad laminate employed in the process is generally as thick as 35–70μm so that the side walls of the conductive layers of the resulting wiring pattern are overetched to be undercut when it is subjected to etching for removing the copper foil at parts where no etching resist is formed.

Further, the conductive layers of the wiring pattern protrude from the surface of the wiring board after fabricated. When another wiring pattern is formed over the conductive lines of the first-mentioned wiring pattern through an insulating layer to fabricate a multilayer wiring board, the rugged profile of the surface of the first-mentioned wiring board poses a problem for the fabrication of a high-density multilayer wiring board.

Another widely used fabrication process of a wiring board is the additive process which forms a wiring pattern by electroless plating without causing undercut. In the additive process, however, precipitation of plating occurs during the electroless plating on undesirable parts.

Due to these problems found in the prior art, the formation of a fine wiring pattern is limited.

A process has been proposed, in Japanese Patent Publication No. SHO 54-35670, for example, to fabricate a wiring board in which wiring conductive lines are embedded in a substrate to present a smooth surface.

However this patent also presents limitation upon the formation of a high-density and high-accuracy wiring pattern, wiring conductive lines are formed on a stainless steel sheet, the stainless steel sheet is pressed under heat against an insulating substrate with a prepreg interposed therebetween, and the stainless steel sheet is then removed. Since the wiring conductive lines are directly formed on the stainless steel sheet, some damage may be caused on the wiring conductive lines upon removal of the stainless steel sheet. In addition, the use of the stainless steel sheet does not allow a continuous flow in the fabrication process.

SUMMARY OF THE INVENTION

It is an object of the present invention to provide a wiring board fabrication process which is, not only so smooth on the surface that a fine wiring pattern can be formed thereon, but also one suitable for mounting electronic parts having fine pitch terminals.

The present invention is a fabrication process of a wiring board which comprises a wiring conductive line embedded in the surface of an insulating substrate so that the upper face of the conductive line and the surface of the substrate are flat, and a through-hole land which is a conductive portion projected from the surface of the substrate in a through-hole portion, which is characterized in removing the conductive portion projected from the surface of the substrate in the through-hole portion so as to have a flat surface on the surface of the substrate.

BRIEF DESCRIPTION OF THE DRAWINGS

FIGS. 1(a)–(d) and FIGS. 2(a)–(e) show several processing steps of a wiring board fabrication process according to this invention.

DESCRIPTION OF PREFERRED EMBODIMENT

The wiring board fabrication process according to the present invention will now be described with reference to FIG. 1 and FIG. 2

On one side of a 35μm thick copper foil as a carrier metal foil 10 made of a first metal, nickel was formed by electroplating to a thickness of 1μm as a thin layer 11 made of a second metal whose etching conditions are different from those of the first metal [FIG. 1(b)]. Thereafter, a photosensitive resist film 12 was formed, exposed and developed so that grooves of 25μm in depth were formed corresponding to a desired wiring pattern [FIG. 1(c)]. By feeding an electric current through the copper foil, copper was formed to a thickness of 20μm on the nickel exposed at the bottoms of the grooves which corresponded to the desired wiring pattern, whereby the desired wiring pattern 13 was formed with the third metal whose etching conditions are different from the second metal. The resist was next stripped off and the copper of the wiring was subjected to oxidation treatment to improve its interlayer adhesion upon lamination.

Figure 2A:
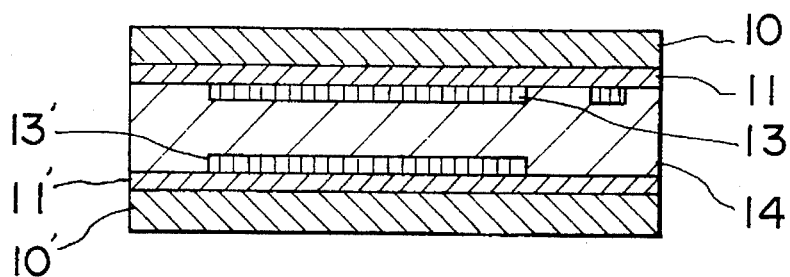
Figure 2B:
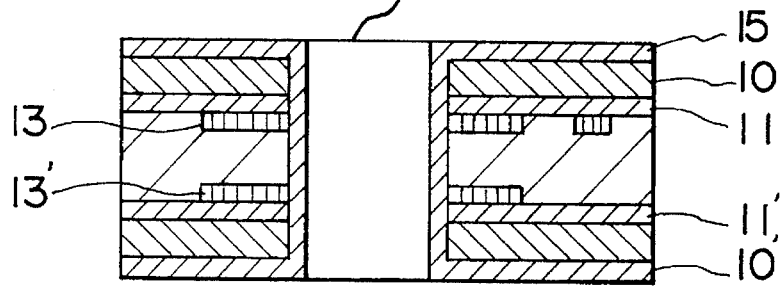

In the same way, as shown in FIG. 2(a), a desired wiring pattern 13' was formed on a nickel layer 11' formed on a copper foil 10'. A glass fabric-epoxy resin laminate 14 was then pressed under heat via an insulating substrate, namely, a glass fabric-epoxy resin prepreg between the copper foils 10, 10', so that the glass fabric-epoxy resin laminate 14 and the copper foils 10, 10' were integrated with the wiring patterns 13, 13' embedded in the insulating substrate therebetween [FIG. 2(a)]. Prior to embedding the wiring patterns 13, 13' in the insulating substrate, the sides of the wiring patterns 13, 13' may alternatively be coated with a resin so that the wiring patterns 13, 13' are fixed. As the case may be, the stripping of the resist may be omitted.

The carrier metal foils 10, 10' made of the first metal, copper foil, can be replaced by metals such as stainless steel or aluminum. Its thickness can range preferably from 20μm to 100μm. The thin layers 11, 11' made of the second metal, nickel, can be replaced by metals such as gold, aluminum, copper or titanium. Its preferred thickness can range from 0.1μm to 10μm. To form the thin layers 11, 11', a desired process can be used including electroplating, electroless plating or vacuum film-forming (e.g., vacuum deposition, sputtering or the like). Where gold is used, the wiring patterns 13, 13' serve as a substrate film for plating gold when electroless thick gold plating is applied for wire bonding subsequent to the pressed transfer of the wiring patterns 13, 13' and the removal of the carrier metal foils 10, 10'. In this case, it is preferred to coat, with a permanent resist, parts other than those requiring the thick gold plating.

For the desired wiring patterns 13, 13' made of the third metal, use of copper is preferred. Regarding the first, second and third metals, it is required at least that the etching conditions differ between the first metal and the second metal and also between the second metal and the third metal. The metal may be an alloy.

In addition, the carrier metal foils 10, 10', the thin metal layers 11, 11', and the desired wiring patterns 13, 13' may be made of different metals, respectively. However, in a case where the etching conditions of the metals are different, the upper and lower portions of the substrate should be subjected to etching separately.

No particular limitation is imposed on the insulating substrate as long as the wiring pattern can be embedded therein. Examples of the insulating substrate include: laminates such as a glass fabric-epoxy resin laminate having on a surface thereof a prepreg which has been formed by impregnating a base material such as a glass fabric with a synthetic resin such as an epoxy resin and then curing the synthetic resin; synthetic resin films such as a polyimide film; and adhesive-applied laminates.

It is preferred to apply both heat and pressure upon superposing two carrier metal foils, each carrying the desired wiring patterns formed thereon, on the insulating substrate with the sides of the wiring pattern being positioned inside and hence embedding the wiring patterns in the insulating substrate.

In the wiring-pattern-bearing carrier metal foil which is employed in the present invention and is composed of the carrier metal foil made of the first metal, the thin layer formed on one side of the carrier metal foil and made of the second metal whose etching conditions are different from those of the first metal, and the desired wiring pattern formed on the surface of the thin layer, which is made of the second metal, with the third metal whose etching conditions are different from those of the second metal. In such a wiring-pattern-bearing carrier metal foil, the coefficient of thermal expansion of the wiring-pattern-bearing carrier metal foil can be adjusted to bring it into conformity with that of the insulating substrate. The wiring pattern may be improved by adjusting heat and pressure at the time the pattern was embedded. The heating temperature range may be adjusted by choosing a suitable material and thickness of the carrier metal foil and also the material, thickness and number of the thin metal layer(s) formed on the one side of the carrier metal foil. This makes it possible to improve the dimensional accuracy of the wiring pattern.

The wiring-pattern-bearing metal foil is highly flexible so that the shape of the insulating substrate in which the wiring patterns are embedded, namely, the shape of both faces into which the wiring patterns are transferred can be curved as well as planar surfaces. When a stainless steel sheet or the like is employed as a carrier plate, a limitation is imposed on its size. However the carrier metal foil of the present invention makes it possible not only to achieve easy enlargement but also continual processing in the fabrication process, from the carrier metal foil to the fabrication of the wiring-pattern-bearing metal foil.

As a modification of the process shown in FIG. 1, it is possible to form the wiring pattern 13 by an etching technique. Namely, a wiring pattern can be formed by forming a third metal layer on the entire surface of the thin layer 11 of the second metal in FIG. 1(b), forming an etching pattern and then etching the third metal layer.

At a desired position of a substrate in which the wiring-pattern-bearing metal foils are laminated on both faces of the insulating substrate 15 [FIG. 2 (a)], a through-hole 18 is formed. The through-hole 18 penetrates through the upper carrier metal foil 10, the thin metal layer 11 formed on the upper carrier metal foil 10, the wiring pattern 13 formed on the thin metal layer 11, the insulating substrate 14, the lower carrier metal foil 10', the thin metal layer 11' formed on the lower carrier metal foil 10', and the wiring pattern 13 formed on the thin metal layer 11' To form the through-hole, ordinary methods, such as drilling and punching, are used.

After the through-hole 18 is formed, a metal plated layer 15 is formed all over the surface of upper and lower carrier metal foils and the inner wall of the through-hole. The step is to form panel plating.

The panel plating is formed, for example, by the following steps. A substrate in which a through-hole is formed is treated with a palladium chloride type catalyst ("HS-201", trade name; product of Hitachi Chemical Co., Ltd.) followed by a treatment with an adhesive promotion solution ("ADP-201", trade name; product of Hitachi Chemical Co., Ltd.), and then, a copper layer as thick as 0.2 to 0.3μm is formed by electroless plating. As a electroless plating solution, "CUST-201" trade name; product of Hitachi Chemical Co., Ltd. is used under the condition of room temperature to 40° C. for 20 minutes. Next, a copper plating as thick as 35 μm is formed by electroplating. Cupric sulfate liquid is used for the electroplating under the condition of room temperature to 40° C. for 70 minutes, current density of $2A/dm^2$.

Figure 2C:
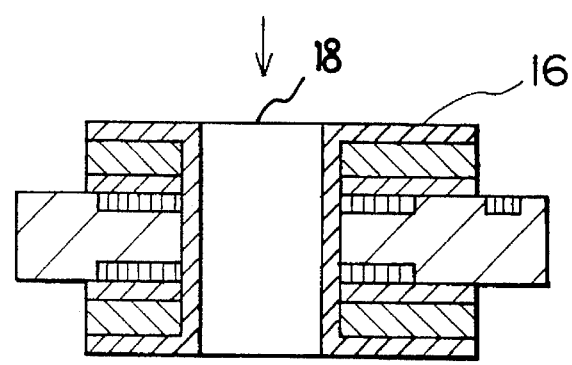

As shown in FIG. 2(c), the metal plated layer 15, the upper carrier metal foil 10, the thin metal layer 11 formed on the upper carrier metal foil 10, the lower carrier metal foil 10', and the thin metal layer 11' formed on the lower carrier metal foil 10' are etched off excepting the area around the through-hole, which is to be a through-hole land 16. The through-hole land is formed, for example, by tenting method as will be shown below. A photo-sensitive film ("Photec HK 450" , trade name; product of Hitachi Chemical Co., Ltd.) formed all over the substrate is exposed and developed so as to form etching resist on an area to be the through-hole land. The copper layer as the metal plated layer, the copper foils as the carrier metal foils 10, 10' are etched off with copper etchant, such as solutions of ferric chloride and cupric chloride. The nickel layer as the thin metal layer is removed with a nickel etchant ("Melstrip", trade name; product of Japan Meltex inc. bath TEMPERATURE: 45±3° C.), and then the etching resist is removed.

Figure 2D:

As shown in FIG. 2(d), the through-hole land 16 is removed by mechanical polishing. In order to remove the nickel layer of the through-hole land completely, nickel etchant can be used for etching. In a wiring board fabrication process for forming a copper foil as the carrier metal, superposing and pressing the carrier metal foil, which carried the desired wiring pattern formed thereon, on and against an insulating substrate with the wiring pattern facing the insulating substrate, to embed the wiring pattern in the insulating substrate, in a case of forming a through-hole to connect wiring patterns transferred or embedded on different layers, the through-hole land is formed by etching a copper foil being a temporary substrate and will project higher than the surface of the substrate. On the other hand, the transferred wiring portion is embedded in the substrate so as to have a flat surface. Such a structure has a following defect.

In a case where electronic parts are mounted on a soldering land which is an embedded wiring portion, the through-hole land comes into contact with the bottom of the mounted parts, which results in occurrence of cracks at soldering terminals due to occurrence of rise of the terminals or occurrence of large stress at the time of temperature cycle, and will cause poor connection.

The wiring board according to the present invention, which solves the problem, has a flat surface capable of forming a fine wiring, and is suitable for mounting fine pitch terminal parts.

Figure 2E:
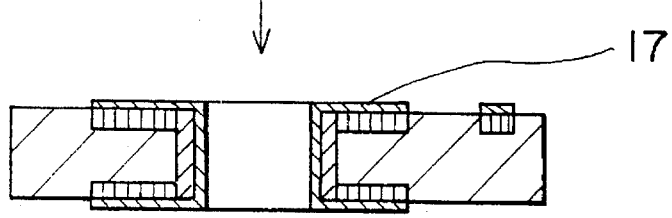

As shown in FIG. 2(e), the wiring conductive lines are sometimes provided with overlay plating 17 having the thickness of approximately 5 to 10μm to improve the reliability of connection at the through-hole portion. The overlay plating is performed by electroless plating with copper or gold.

We claim:

1. A process for the fabrication of a wiring board, which comprises the following steps:

(A) forming on one side of a first carrier metal foil made of a first metal, a first thin layer of a second metal whose etching conditions are different from those of the first metal;

(B) forming, on the surface of said first thin layer of said second metal, a first desired wiring pattern of a third metal whose etching conditions are different from those of the second metal;

(C) forming on one side of a second carrier metal foil made of a fourth metal, a second thin layer of a fifth metal whose etching conditions are different from those of the fourth metal;

(D) forming, on the surface of said second thin layer of said fifth metal, a second desired wiring pattern of a sixth metal whose etching conditions are different from those of the fifth metal;

(E) superposing and pressing said first and second carrier metal foils, each having the desired wiring pattern on the thin layer formed thereon, on and against an insulating substrate therebetween with said wiring pattern facing said insulating substrate, to embed the wiring pattern in both faces of the insulting substrate;

(F) forming a through-hole which penetrates through said first carrier metal foil, said first thin layer, said first wiring pattern, said insulating substrate, said second wiring pattern, said second thin layer, and said second carrier metal foil;

(G) forming a metal plating layer over the surface of said first carrier metal foil, the surface of said second carrier metal foil, and the surface of inner wall of said through-hole;

(H) forming a substrate whose through-hole land portion protrudes from the surface, by etching off the metal plating layer formed on said first carrier metal foil, said carrier metal foil, said first thin layer, said second thin layer, said second carrier metal foil, and the metal plating layer formed on said second carrier metal foil, excepting an area to be the through-hole land portion; and (I) mechanically removing said through-hole land portion so as to have a smooth surface of the substrate around the through-hole.

2. A process for the fabrication of a wiring board as claimed in claim 1, after the step (I), further comprises the step of:

(J) forming a metal plating layer on exposed surface of wiring pattern and the inner wall of the through-hole.

3. A process for the fabrication of a wiring board as claimed in claim 1, wherein:

said fourth metal is the same metal as said first metal;

said fifth metal is the same metal as said second metal; and said sixth metal is the same metal as said third metal.

* * * * *